US 6,751,448 B1

United States Patent
Frydman et al.

(10) Patent No.: US 6,751,448 B1
(45) Date of Patent: Jun. 15, 2004

(54) CONTROL OF TRANSMISSION POWER IN A COMMUNICATION SYSTEM

(75) Inventors: Javier Frydman, Tzoran (IL); Erez Schwartz, Kfar Saba (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/417,077

(22) Filed: Oct. 13, 1999

(51) Int. Cl.$^7$ ................................................ H04Q 7/20
(52) U.S. Cl. ...................... 455/126; 455/127.1; 455/69; 455/522
(58) Field of Search ................................ 455/522, 423, 455/13.4, 38.3, 512, 513, 515, 67.1, 69, 571, 572, 575, 115, 123, 126, 127, 136, 574, 125; 370/318, 311, 515; 375/141, 146

(56) References Cited

U.S. PATENT DOCUMENTS

| 3,925,782 | A | * | 12/1975 | Anderl et al. ................ 455/507 |
| 5,054,116 | A | | 10/1991 | Davidson |
| 5,193,223 | A | | 3/1993 | Walczak et al. |
| 5,214,372 | A | * | 5/1993 | Vaisanen et al. ............. 324/95 |
| 5,267,262 | A | * | 11/1993 | Wheatley, III ............... 375/200 |
| 5,287,555 | A | | 2/1994 | Wilson et al. |
| 5,304,947 | A | * | 4/1994 | Carlsson ..................... 330/279 |
| 5,323,329 | A | | 6/1994 | Keane |
| 5,438,683 | A | * | 8/1995 | Durtler et al. ................ 455/74 |
| 5,471,146 | A | * | 11/1995 | Krayeski et al. ............. 455/67.1 |
| 5,530,923 | A | * | 6/1996 | Heinonen et al. ........... 455/126 |
| 5,564,084 | A | | 10/1996 | Hirasawa |
| 5,564,086 | A | | 10/1996 | Cygan et al. |
| 5,574,991 | A | | 11/1996 | Miyama et al. |
| 5,623,486 | A | * | 4/1997 | Dohi et al. ................... 370/342 |
| 5,697,073 | A | * | 12/1997 | Daniel et al. ................ 455/126 |
| 5,710,991 | A | * | 1/1998 | Lee ............................. 455/126 |
| 5,732,334 | A | | 3/1998 | Miyake |
| 5,752,172 | A | | 5/1998 | Matero |
| 5,790,940 | A | * | 8/1998 | Laborde et al. .............. 455/69 |
| 5,832,373 | A | | 11/1998 | Nakanishi et al. |
| 5,839,052 | A | * | 11/1998 | Dean et al. .................. 725/106 |
| 5,839,056 | A | * | 11/1998 | Hakkinen ..................... 455/522 |
| 5,974,093 | A | * | 10/1999 | Lee ............................. 375/297 |
| 5,982,760 | A | * | 11/1999 | Chen ............................ 370/335 |
| 5,987,307 | A | * | 11/1999 | Buskirk et al. ................ 455/73 |
| 6,173,163 | B1 | * | 1/2001 | Northcutt ..................... 455/126 |
| 6,301,485 | B1 | * | 10/2001 | Lee ............................. 455/522 |

FOREIGN PATENT DOCUMENTS

| EP | 0 416 613 A2 | 3/1991 |
| EP | 0462 952 A1 | 12/1991 |
| EP | 688109 A2 | 12/1995 |

* cited by examiner

Primary Examiner—Jean Gelin
(74) Attorney, Agent, or Firm—Eitan, Pearl, Latzer & Cohen Zedek, LLP

(57) ABSTRACT

A system for controlling transmission power of a transmitter in a pseudo-random gated output power digital communication system includes a power measurement unit for producing a transmission power measurement only when transmission is enabled, and a processing unit for comparing the transmission power measurement to a desired power and for determining a power setting of the transmitter. A method for controlling the transmission power of a transmitter in a pseudo-random gated output power digital communication system includes the steps of comparing a measured transmitted power at an antenna to a desired power only when transmission is enabled, and adjusting a power setting of the transmitter according to the difference between the measured transmitted power and the desired power.

9 Claims, 3 Drawing Sheets

CONTROL OF TRANSMISSION POWER IN A COMMUNICATION SYSTEM

FIELD OF THE INVENTION

The present invention relates to digital communication systems, in general, and to controlling the transmission power of such systems, In particular.

BACKGROUND OF THE INVENTION

Batteries are used for powering digital communication transmitters in mobile stations such as cellular handsets. It is desirable to reduce the power consumption of the mobile station as much as possible in order to enable the use of lighter batteries.

When transmitting a signal, the power of the transmitted radio frequency (RF) signal ("transmission power") must be within a range defined by the digital communications standard and selected by the base station. Reference is now made to FIGS. 1A and 1B, which are schematic illustrations of prior art transmission power levels. The permissible transmission power varies between the values of MAX_POWER and MIN_POWER, thereby defining a range R. An error range E expresses the possible discrepancy between the desired transmission power and the actual transmission power at the antenna. Many factors affect the size of this error range E. For example, the inherent inaccuracy of the RF amplifier that converts and amplifies the digital transmission signal has an inherent inaccuracy due to temperature fluctuations, instability of its power supply and frequency response flatness. An additional factor is the lack of impedance matching between the antenna and the RF amplifier. Typically, the error range E can be as large as 3 dB.

FIG. 1A shows an attempt to set the desired transmission power too low. Since the error range E is large, the actual transmission power at the antenna may be less than the limit MIN_POWER. This is unacceptable.

As shown in FIG. 1B, in order not to exceed the limits MAX_POWER and MIN_POWER of the range R, conventional prior art transmission systems set the desired transmission power setting to the mean power of the range, MEAN_POWER. Clearly, transmission at the mean power of the range R consumes more power than transmission at powers in the lower half of the range R. It would be beneficial to create a system and method for transmitting at a power which is within the range R and yet is lower than the mean power, MEAN_POWER.

The following patents and patent applications describe a variety of devices and methods for controlling or monitoring the transmission power in a communication system.

U.S. Pat. No. 5,832,373 to Nakanishi et al. discloses a digital power control device in a time division multiple access (TDMA) system. The device measures the actual transmitted power at the antenna and with a digital feedback loop, adjusts the gain of the RF amplifier. The digital feedback loop is synchronized with predetermined transmission bursts. U.S. Pat. No. 5,752,172 to Matero discloses an analog loop with a comparator for maintaining a given level of power in a transmitted signal, based on measurement of the actual transmitted power at the antenna.

U.S. Pat. No. 5,323,239 to Keane disclose a digitally-assisted power-leveling circuit for an RF power generator. U.S. Pat. No. 5,574,991 to Miyama et al. discloses a transmission power control circuit. U.S. Pat. No. 5,564,084 to Hirasawa discloses a transmission power level monitoring apparatus employed in a TDMA (time division multiple access) commutation system.

U.S. Pat. No. 5,287,555 to Wilson et al. disclose power control circuitry for a TDMA radio frequency transmitter. U.S. Pat. No. 5,564,086 to Cygan ct al. discloses a method and apparatus for enhancing an operating characteristic of a radio transmitter EP 0416 613 A2 to Toda, assigned to Fujitsu, discloses a transmission power control circuit. EP 0462 952 A1 to Larsson et al., assigned to Ericsson, discloses a method for regulating power in a digital mobile telephony system.

There a several advanced digital communication system using pseudo-random or random gated output power ("pseudo random bursts"), for example, IS-95, wideband code division multiple access (W-CDMA), CDMA2000, both frequency division duplex (FDD) and time division duplex (TDD) modes. None of the above mentioned references is capable of controlling the power of the transmitted RF signal in such systems. It will be appreciated that in such a system, not only is the timing of the transmission random, but the strength of the transmission cannot be anticipated.

There is provided in accordance with a preferred embodiment of the present invention a method for controlling the transmission power of a transmitter in a pseudo-random gated output power digital communication system. The method includes the steps of comparing a measured transmitted power at an antenna to a desired power only when transmission is enabled, and adjusting a power setting of the transmitter according to the difference between the measured transmitted power and the desired power.

Moreover, in accordance with a preferred embodiment of the present invention, the desired power is set lower than the mean power of an allowed range of transmission powers.

Furthermore, in accordance with a preferred embodiment of the present invention, the step of comparing is performed only when the transmitter issues a read request.

Additionally, in accordance with a preferred embodiment of the present invention, the transmitter issues the read request according to previous measurements of transmitted power and factors characterizing the transmitter when the previous measurements were made.

There is also provided in accordance with a preferred embodiment of the present invention, a system for controlling transmission power of a transmitter in a pseudo-random gated output power digital communication system. The system includes a power measurement unit for producing a transmission power measurement only when transmission is enabled, and a processing unit for comparing the transmission power measurement to a desired power and for determining a power setting of the transmitter.

Moreover, in accordance with a preferred embodiment of the present invention, the desired power is set lower than the mean power of an allowed range of transmission powers.

Furthermore, in accordance with a preferred embodiment of the present invention, the transmitter has an antenna, and the power measurement unit includes a power sensor, an analog to digital converter, and a control logic unit. The power sensor measures transmission power at the antenna, thereby producing an analog measurement. The analog to digital converter converts the analog measurement to the transmission power measurement. The control logic unit enables operation of the analog to digital converter only when transmission is enabled.

Additionally, in accordance with a preferred embodiment of the present invention, the processing unit includes a processor for issuing a read request, and the control logic unit enables operation of the analog to digital converter oily when the processor issues the read request.

Finally, in accordance with a preferred embodiment of the present invention, the processor issues the read request according to previous measurements of transmitted power and factors characterizing the transmitter when the previous.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

The present invention provides a system and method for controlling the power of a transmitted radio frequency (RF) signal in a pseudo-random, gated output power communication system. In the specification and claims, the meaning of the term "pseudo-random" is extended to include also the term "random".

Figure 1A:
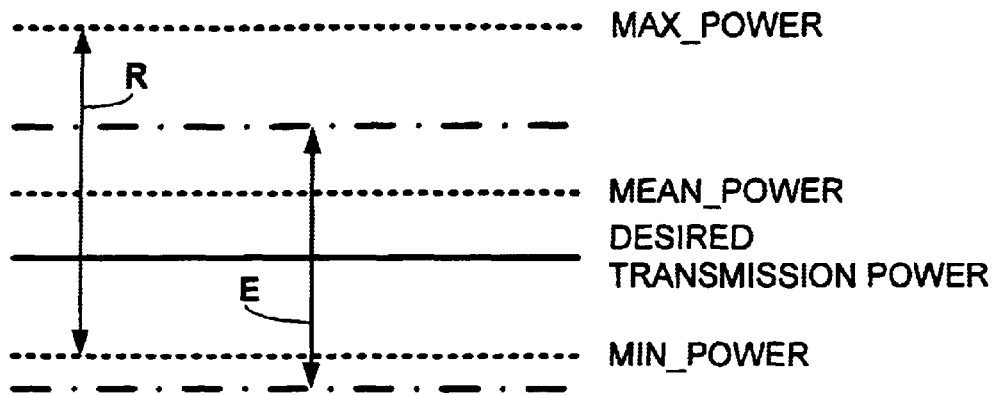
FIGS. 1A and 1B are schematic illustrations of prior art transmission power levels.
Figure 1B:
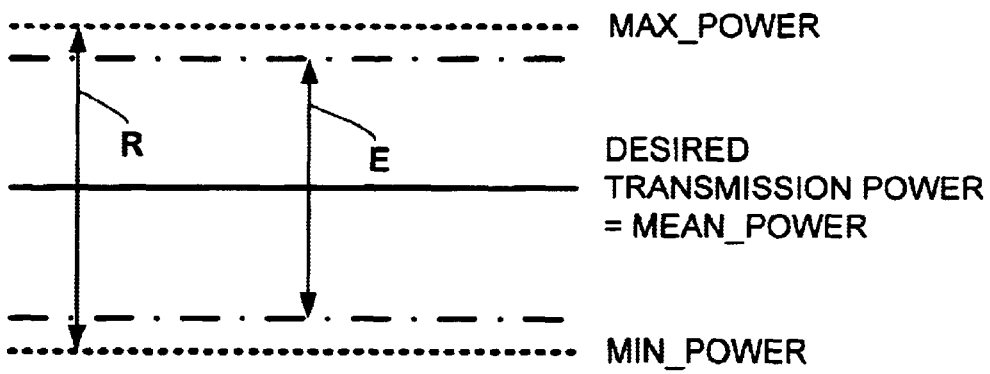
Figure 2:
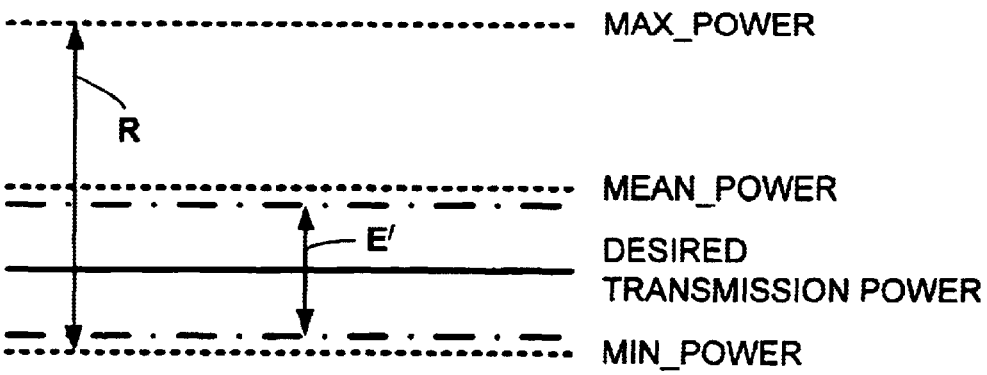
FIG. 2 is a schematic illustration of the transmission power levels, in accordance with a preferred embodiment of the present invention.

Reference is now made to FIG. 2, which is a schematic illustration of the transmission power levels, in accordance with a preferred embodiment of the present invention. The system of the present invention has a smaller error range E than the error range E of FIGS. 1A and 1B. Since the error range has been reduced, the desired transmission power can be set to a level that is lower than the mean power MEAN_POWER of the range, while ensuring that the limits MAX_POWER and MIN_POWER are not exceeded.

Figure 3:
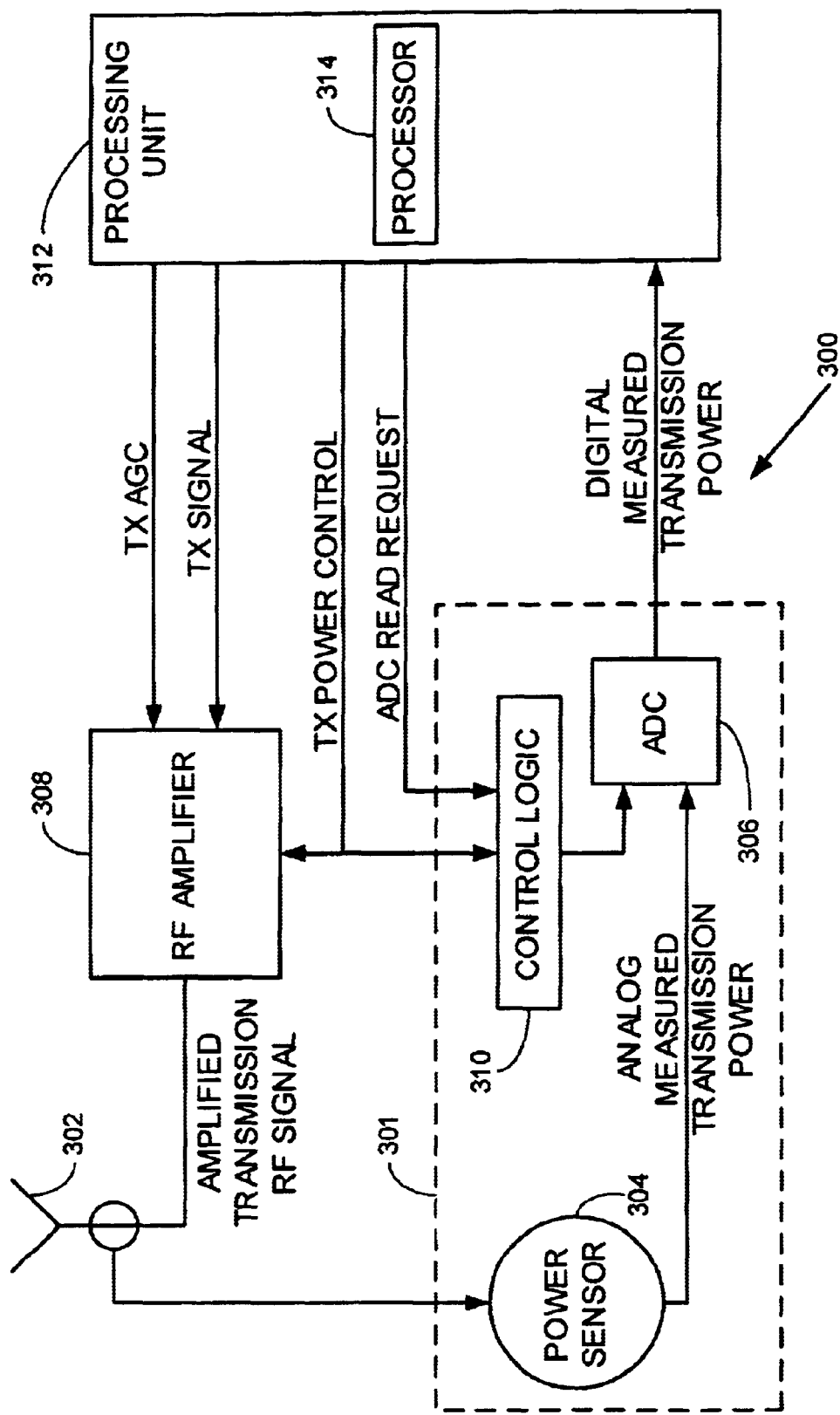
FIG. 3 is a simplified block diagram illustration of a system for controlling transmission power, in accordance with a preferred embodiment of the present invention.

Reference is now made to FIG. 3, which is a simplified block diagram is illustration of a system for controlling transmission power, generally referenced 300, in accordance with a preferred embodiment of the present invention. The system 300 comprises an antenna 302, a power measurement unit 301, a radio frequency (RF) amplifier 308 and a processing unit 312. The power measurement unit 301 comprises a power sensor 304, an analog to digital converter (ADC) 306 and a control logic unit 310.

The power sensor 304 measures the power of the transmitted signal at the antenna 302 and provides the analog measured transmission power to the ADC 306. When enabled, the ADC 306 converts the analog measured transmission power to a digital measured transmission power. The processing unit 312 provides a transmission signal TX SIGNAL and a transmission automatic gain control (AGC) signal TX AGC to the RF amplifier 308. The processing unit 312 also provides a transmission power control signal TX POWER CONTROL to the RF amplifier 308 and to the control logic unit 310. In addition, the processing unit 312 provides an ADC read request signal ADC READ REQUEST to the control logic unit 310.

The transmission signal TX SIGNAL is a continuous stream of data that contains the information to be transmitted. The transmission power control signal TX POWER CONTROL controls when the RF amplifier 308 transmits the transmission signal TX SIGNAL. In a particular implementation of a system using burst transmission, for example, a high transmission power control signal causes the RF amplifier 308 to transmit the transmission signal, while a low transmission power control signal causes the RF amplifier 308 to block transmission of the transmission signal. In a pseudo-random gated output power system, the transmission power control signal changes its value with pseudo-random timing. The RF amplifier 308 amplifies the transmission signal TX SIGNAL by a factor ("gain") defined in the transmission AGC signal TX AGC.

The control logic unit 310 synchronizes the operation of the ADC 306 with the transmission power control signal TX POWER CONTROL. The ADC 306 also takes into account the time constant of the power sensor 304, because the power sensor 304 has converged to its final value by the time the ADC 306 samples the value. Therefore, the conversion of the measured transmission power is performed only when the transmission 13 enabled through the transmission power control signal TX POWER CONTROL and the power level of the power sensor 304 is stable. Since the conversion of the measured transmission power is synchronized with the transmission power control signal TX POWER CONTROL, the system 300 is suitable for use even with pseudo-random bursts or power changes.

The control logic unit 310 performs logical operations to determine the correct moment when the ADC 300 should be enabled. For example, a simple AND gate could be implemented. The control logic unit 310 can also look for different conditions, for example measuring power leakage and detecting malfunctions, when the transmission power signal TX POWER CONTROL is off.

In According to another preferred embodiment of the present invention, the control logic unit 310 synchronizes the operation of the ADC 306 both with the transmission power control signal TX POWER CONTROL and with the ADC read request signal ADC READ REQUEST. The ADC 306 also takes into account the time constant of the power sensor 304. In this embodiment, the it conversion of the measured transmission power is performed only when the transmission is enabled through the transmission power control signal TX POWER CONTROL, an ADC read request is pending and the power level of the power sensor 304 is stable.

It will be appreciated that the system 300 is a closed loop system having a feedback loop with the ADC 306. The processing unit 312 sets the transmission AGC signal TX AGC according to the digital measured transmission power in order to produce the desired transmission power at the antenna 302. The accuracy of the feedback loop is based upon the inherent accuracy of the power sensor 304, which is typically around 0.2 dB over the entire RF frequency range and 0.2 dB over the temperature range 30° C.–85° C.

Figure 4:
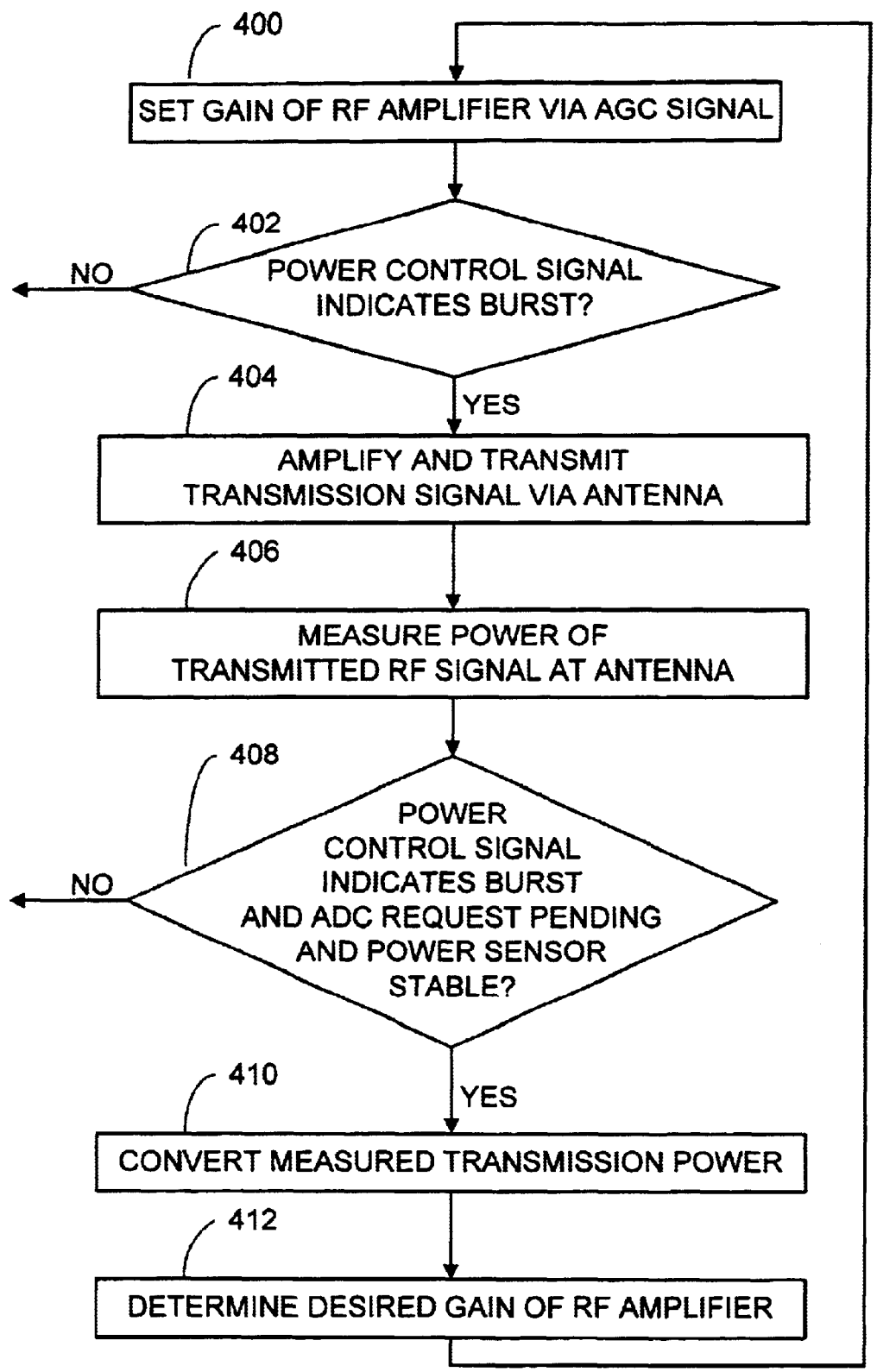
FIG. 4 is a schematic flowchart illustration of a method for controlling transmission power using the system of FIG. 3, in accordance with a preferred embodiment of the present invention.

Reference is made additionally to FIG. 4, which is a schematic flowchart illustration of a method for controlling transmission power using the system of FIG. 3. In accordance with a preferred embodiment of the present invention. The processing unit 312 sets the gain of the RF amplifier 308 via the AGC signal TX AGC (step 400). If the transmission power control signal TX POWER CONTROL enables transmission (step 402), then the RF amplifier 308 amplifies the transmission signal TX SIGNAL and transmits the RF signal via the antenna 302 (step 404). The power sensor 304 measures the power of the transmitted RF signal at the antenna 302 (step 405). If the transmission power control signal TX POWER CONTROL enables transmission, if there is an ADC read request pending, and if the power sensor 304 is stable (step 408), then the ADC 306 converts the measured transmission power to a digital value and is provides it to the processing unit 312 (step 410). The processing unit 312 uses the digital measured transmission power to determine a new desired gain of the RF amplifier 308 (step 412), and then the method returns to step 400.

The ADC read requests are issued by the processing unit 312 according to various factors. For example, tie ADC read requests might be more frequent as the temperature rises. In another example, the ADC requests may be more frequent at transmission frequencies where the RF amplifier 308 is known to be less accurate. In a preferred embodiment of the present invention, the processing unit 312 comprises a processor 314, for example, but not limited to, a digital signal processor (DSP), which determines when to issue the ADC read requests. The processing unit 312 can be self-learning, so that ADC read request are issued based on properties characterizing cases where measured transmitted power varies from the set transmitted power by more than a predetermined tolerance. Furthermore, using the processor 314, the processing unit 312 can save values of the transmission AGC signal TX AGC along with scenario data related to the measured transmitted power and the transmitted power that was set. Then, when the processing unit 312 identifies a particular scenario, it can adjust the transmission AGC signal TX AGC according to the saved values.

The methods and apparatus disclosed herein have been described without reference to specific hardware or software. Rather, the methods and apparatus have been described in a manner sufficient to enable persons of ordinary skill in the art to readily adapt commercially available hardware and software as may be needed to reduce any of the embodiments of the present invention to practice without undue experimentation and using conventional techniques.

It will be appreciated by persons skilled in the art that the present invention is not limited by what has been particularly shown and described herein above. Rather the scope of the invention is defined by the claims that follow.

What is claimed is:

1. A method comprising:
    generating a control signal having pseudo-random timing said control signal determining whether an amplifier of a transmitter blocks or amplifies a transmission signal;
    comparing a measured power of an amplified transmission signal transmitted at an antenna of said transmitter to a desired power only if said control signal enables said amplifier to amplifier said transmission signal; and
    adjusting a power setting of said transmitter according to the difference between said measured power and said desired power.

2. A method according to claim 1, wherein said desired power is set lower than the mean power of an allowed range of transmission powers.

3. A method according to claim 1, wherein comparing said measured power to said desired power is performed only if a read request is pending.

4. A method according to claim 3, wherein a processing unit of said transmitter issues said read request according to previous measurements of power of transmitter signals and factors characterizing said transmitter when said previous measurements were made.

5. A transmitter comprising:
    an antenna;
    an amplifier coupled to said antenna to block or amplify a transmission signal according to a control signal having pseudo-random timing;
    a power measurement unit coupled to said antenna to produce a digital transmission power measurement of power of an amplified transmission signal transmitted at said antenna only if said control signal enables said amplifier to amplify said transmission signal; and
    a processing unit to compare said measurement to a desired power and to determine a power setting of said transmitter.

6. A transmitter according to claim 5, wherein said desired power is set lower than the mean power of an allowed range of transmission powers.

7. A transmitter according to claim 5, wherein said power measurement unit comprises:
    a power sensor to produce an analog measurement of power of said amplified transmission signal;
    an analog to digital converter to convert said analog measurement to said transmission power measurement; and
    a control logic unit to enable operation of said analog to digital converter only if said control signal enables said amplifier to amplify said transmission signal.

8. A transmitter according to claim 7, wherein said control logic unit enables operation of said analog to digital converter only if a read request issued by said processing unit is pending.

9. A transmitter according to claim 8, wherein said processing unit is to issue said read request according to previous measurements of power of transmitted signals and factors characterizing said transmitter when said previous measurements were made.

* * * * *